(12) United States Patent
Doil

(10) Patent No.: US 6,810,051 B2
(45) Date of Patent: Oct. 26, 2004

(54) APPARATUS AND METHOD FOR LASER DRIVER OPERATION

(75) Inventor: Thorsten Doil, Hildesheim (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/346,929

(22) Filed: Jan. 17, 2003

(65) Prior Publication Data
US 2003/0138011 A1 Jul. 24, 2003

(30) Foreign Application Priority Data
Jan. 22, 2002 (EP) ............................................. 02001096

(51) Int. Cl.[7] ................................................. H01S 3/00
(52) U.S. Cl. ................................................... 372/38.02
(58) Field of Search ............................. 372/38.1–38.09, 372/33

(56) References Cited

U.S. PATENT DOCUMENTS

| 5,309,461 A | * | 5/1994 | Call et al. ................. 372/38.09 |
| 5,883,910 A | * | 3/1999 | Link ........................ 372/38.07 |
| 6,549,316 B2 | * | 4/2003 | Blauvelt ..................... 398/119 |

* cited by examiner

Primary Examiner—Quyen Leung

(57) ABSTRACT

For a direct modulation of a laser module and its laser diode, respectively, a laser driver is AC coupled to the laser module such that the nominal optical output power of the laser module can be adjusted by a variation of a supply current for the laser module.

17 Claims, 8 Drawing Sheets

APPARATUS AND METHOD FOR LASER DRIVER OPERATION

This application claims the benefit of the filing date as provided by 35 U.S.C. 119 of European patent application number EP-02001096.3 filed on Jan. 22, 2002, the disclosure of which is incorporated herein by reference.

FIELD OF THE INVENTION

The present invention relates in general to laser drivers coupled to laser modules for modulating the laser output thereof. In particular, the present invention relates to solutions enhancing the operation of laser drivers being AC coupled to laser modules.

BACKGROUND OF THE INVENTION

The optical output power of laser diodes varies as a function of temperature and operating time. While temperature effects on the optical output power can be compensated for by cooling of laser diodes, for example by means of cooled laser modules including laser diodes, aging effects require some kind of regulation loop. To compensate the impact of aging it is known to employ a laser module including a monitor diode for monitoring the optical output power of a laser diode. Suitable monitor diodes are optical sensors providing a photo current being representative of the present optical output power of the laser diode. On the basis of the output of the monitor diode, the present optical laser output power is determined to adjust a current used as power supply for the laser module and the laser diode, respectively.

Such a measure for compensating aging effects is also employed for laser modules wherein laser diodes included therein and, in particular, the optical output power of laser diodes is modulated. Depending on the type of laser module, two main principles for modulating the optical laser output power are used in practice. According to one principle, a modulation voltage is applied to a modulator integrated in a laser module while a laser diode thereof itself operates in a continuous wave (CW) mode at a constant so-called laser current, i.e. a current used as power supply for the laser diode and determining the optical laser output power thereof. According to the other principle, a laser diode itself is modulated by means of a modulation current. In the latter case a resulting current actually determining the laser output power can be considered as sum of a laser current usually being a fixed value and a modulation current.

Available laser drivers for a direct modulation of a laser diode by a modulation current are designed for a so-called DC coupling between the laser driver and the laser diode. FIG. 1 illustrates such a DC coupling of a laser driver and a laser module. The laser module includes a laser diode LD, a unit for temperature compensation, such as a thermoelectric cooler and a thermistor for stabilizing the temperature of the laser diode, and a monitoring unit including a photo diode PD which is optically coupled to the laser diode LD.

As set forth above, temperature compensation can be properly achieved by means of the temperature compensating unit, while compensation of aging effects can be obtained by a determination of the optical laser output power. For that purpose, by means of the photo diode PD in response to light from the laser diode LD being dependent from the optical laser output, power the monitoring unit provides a measure, i.e. a photo current, which characterizes the actual optical laser output power.

For a DC coupled operation of the laser driver shown in FIG. 1, the current actually determining the optical output power is a sum of a supply current $I_{source}$ for the laser module and a part of a modulation current $I_{mod}$ supplied from the laser driver. This relation is illustrated in FIG. 2.

Thus, a nominal laser current providing a nominal optical output power $P_{nom}$ is a sum of the supply current $I_{source}$ and a part of the modulation current $I_{mod}$, as shown in FIG. 2.

In response to aging effects of the laser diode, the curve characterizing the optical output power P will drive horizontally towards higher current values, while its slope will generally remain unchanged. This phenomena is illustrated in FIG. 2 by the solid curve representing the initial optical output power characteristics and the dashed curve representing a varied optical output power characteristics due to aging impacts.

Thus, it is complicated to obtain stable operating conditions for such a DC coupled arrangement of a laser driver and a laser module since both the supply current $I_{source}$ and the modulation current $I_{mod}$ have to be modified in order to obtain an age adjusted nominal optical output power $P_{nom}$. Moreover, it is necessary to modify the supply current $I_{source}$ and the modulation current $I_{mod}$ in such a manner that the extinction ratio for the respective laser module is maintained, i.e. kept constant, which is an absolute requirement in most laser optical transmission systems. Due to this aspects, it is necessary to know the actual aging factor.

For DC coupled arrangement of laser drivers and laser modules, the only possible solution is a so-called pilot tone technique for keeping the modulation of the laser diode constant. In the pilot tone technique, a very low frequency signal is added to the modulation current $I_{mod}$. As a result, the laser current for driving the laser diode comprises the supply current $I_{source}$ and a part of the modulation $I_{mod}$, the latter of which being labeled by the low frequency signal. Thus, a photo current provided by the monitoring unit also includes a current portion comprising the low frequency signal or a signal being indicative thereof. By means of filtering measured performed with respect to the current portion including the low frequency signal, it is possible to determine the contributions of the supply current $I_{source}$ and the part of the modulation current $I_{mod}$ for the laser current driving the laser diode. On the basis of such information, it is possible to maintain the nominal extinction ration and optical output power. However, this approach requires a lot of additional circuitry.

BRIEF SUMMARY OF THE INVENTION

In general, the object of the present invention is to overcome the above problems associated with known arrangements of laser drivers and laser modules. In particular, the object of the present invention is to provide solutions for an improved direct modulation of laser diodes by laser drivers with respect to operation time effects such that nominal optical output power and extinction ratio of a laser diode can be easily maintained.

The basic idea underlying the present invention is to employ an AC coupled arrangement of a laser driver and a laser module as shown in FIG. 3. Here, the laser module and the laser driver, both being comparable to the respective components shown in FIG. 1, are AC coupled by means of a capacitor C. While a supply current $I_{source}$ for the laser module is supplied comparable to FIG. 1, a modulation current $I_{mod}$ is provided by the laser driver to the laser module via the capacitor C.

As shown in FIG. 4, as a result of the AC coupled arrangement of FIG. 3, the laser current for driving the laser diode necessary to obtain a nominal optical output power $P_{nom}$ only is a function of the supply current $I_{source}$, but not depending from the modulation current $I_{mod}$. Thus, changes of the optical output power P, for example due to aging effects, can be easily compensated by a respective adjustment of the supply current $I_{source}$ in order to maintain the nominal optical output power $P_{nom}$. For such a compensation, the modulation current $I_{mod}$ is not required to be modified. As a result, a nominal extinction ratio of the laser module can be easily maintained by utilizing the respective modulation current $I_{mod}$, i.e. the same modulation current $I_{mod}$ independently of a value of the supply current $I_{source}$.

In principal, such an AC coupled arrangement of a laser driver and a laser module will solve the object underlying the present invention.

In practice, any laser driver requires a minimum bias current flowing into its output stage, in particular via the output stage port providing the modulation current $I_{mod}$. This is due to the fact, that all available laser drives for a direct modulation of a laser module and its laser diode, respectively, are designed for the above described DC coupling. In contrast, to the arrangement shown in FIG. 1, no DC current path is existing for the output stage port of the laser driver. Thus, no bias current will be applied to the output stage of the laser driver.

A DC current path to the output stage of the laser driver could be obtained by introducing a bias resistor $R_{bias}$ as shown in FIG. 5. Here, the bias resistor $R_{bias}$ is connected between ground and the output stage port. Such an approach would allow for a proper operation of the laser driver with respect to the required bias current. Since the bias resistor $R_{bias}$ being arranged as shown in FIG. 5 increases the AC load of the laser driver, the maximum available modulation amplitude for the laser module, i.e. the maximum available amplitude of the modulation current $I_{mod}$, would be decreased. As a result, the current provided via the output stage port of the laser driver would be partitioned between the bias resistor $R_{bias}$ connected to ground and the modulation current $I_{mod}$ actually supplied to the laser module.

A solution according to the present invention to supply, as an active measure, a bias current to the output stage of the laser driver required for its proper operation. In particular, this is achieved by a bias resistor being coupled to a bias voltage. Moreover, according to the present invention, the bias current being actively supplied to the output stage of the laser driver can be controlled.

As an alternative, the present invention teaches to control the operation of the laser driver in dependence of the modulation current $I_{mod}$ actually supplied to the laser module such that the passive solution, i.e. by means of a grounded bias resistor connected to the laser driver output stage, can be used while the maximum available modulation amplitude of the laser module can still be maintained.

One embodiment according to the invention comprises a laser driver having an output stage which provides a current to be used for a modulation of a laser module and its laser diode, respectively.

Further, this embodiment comprises a unit, for example a capacitor, being connected to the output stage of the laser driver for providing an AC coupling with a laser module. By means of the AC coupling unit, current from the output stage port can be, at least partially, AC coupled to the laser module.

To provide for a bias current to be supplied to the output stage port, as set forth above, a bias current providing unit is coupled to the output stage port.

In particular, the bias current providing unit comprises a bias resistor being coupled to the output stage port, wherein the bias resistor is connected to a bias voltage, which can be a fixed bias voltage.

By coupling the bias resistor to a bias voltage generating unit providing for a variable bias voltage, an enhanced embodiment can be obtained. In particular, the bias voltage generation unit is controlled, directly or indirectly, by a modulation voltage used for the control of the operation of the laser driver and the modulation current, respectively, to be supplied to the laser module.

As an alternative embodiment, the present invention provides an apparatus for modulating a laser module.

This embodiment according to the invention comprises a laser driver having an output stage which provides a current to be used for a modulation of a laser module and its laser diode, respectively.

Further, this embodiment comprises a unit, for example a capacitor, being connected to the output stage of the laser driver for providing an AC coupling with the laser module. By means of a AC coupling unit, current from the output stage port can be, at least partially, AC coupled to the laser module.

To provide for a bias current to be supplied to the output stage port, as set for above, a bias current providing unit is coupled to the output stage port.

In particular, the bias current providing unit comprises a bias resistor being coupled to the output stage port, wherein the bias resistor is connected to ground.

For compensation of the above described decrease of the modulation current actually supplied to the laser module, it is contemplated to use a modulation current sensing unit for determining the modulation current and a modulation voltage generation unit which is controlled in dependence of the determined modulation current. Preferably, the modulation voltage generation unit is controlled by means of an output of the modulation current sensing unit such that the operation of the laser driver compensates a decrease of the modulation current for the laser module resulting from a bias current across the bias resistor. For example, such an operation can be obtained when the laser driver is supplied with a respectively increased modulation voltage.

As an alternate or an option, such an compensation can be obtained by varying the value of the bias resistor being connected to ground. Here it is contemplated to use a modulation current sensing unit, which can be the same as used for the modulation voltage embodiment, to determine the modulation current. In dependence of the determined modulation current, a bias resistor variation unit is controlled such that the bias current necessary for the operation of the laser driver is provided while the required modulation current can be still supplied to the laser module.

For a higher stability and reliability of the operation of the laser driver, the bias resistor can comprise first and second bias resistors, one thereof being coupled to the output stage port, while the other resistor is coupled to the bias voltage or to ground.

Preferably, the first and second bias resistors are connected in series wherein a protection diode is coupled between the first and second bias resistors and connected to ground.

Moreover, the present invention provides a laser module arrangement at least including an embodiment of the apparatus according to the invention. Further, the present invention contemplates methods for modulating a laser module and a computer program product for carrying out at least some of the steps of the methods according to the invention.

DETAILED DESCRIPTION OF THE INVENTION

In the following, it is referred to arrangements of a laser driver and a laser module, wherein the laser driver is supplied with a voltage having a negative potential (see FIGS. 3 and 5 to 10: $V_{ss}<0$). This assumption, mainly due to the fact that commonly used laser drivers require a negative supply voltage, shall not be considered limiting the scope of the present invention. Rather, the principles and solutions according to the present invention also apply for arrangements with reversed polarity, in particular with respect to the laser driver.

Figure 1:
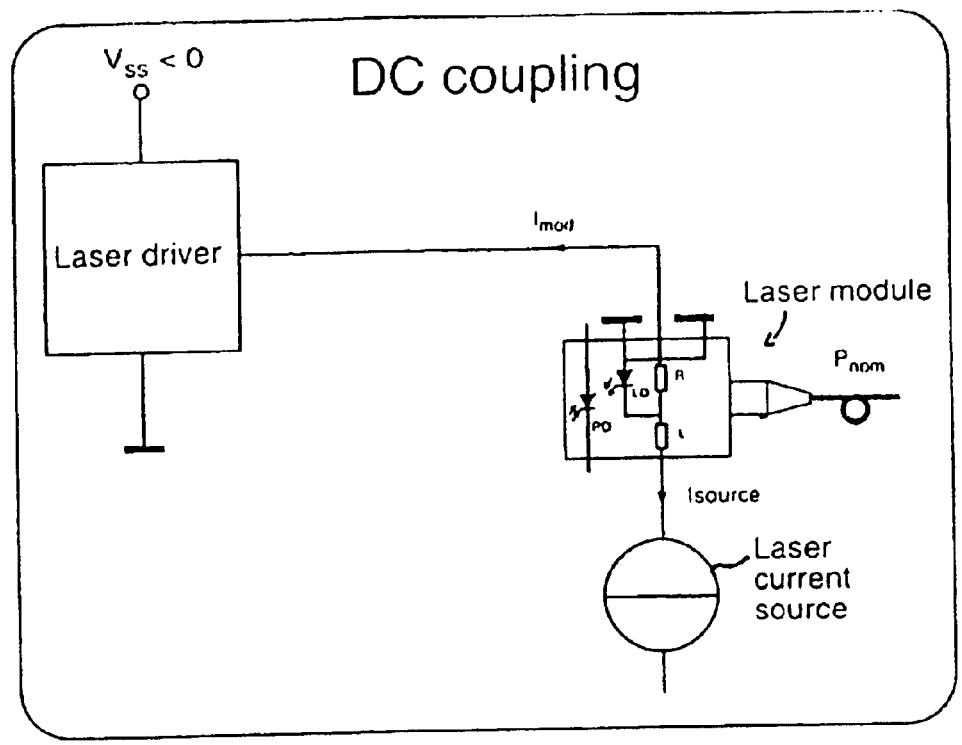
FIG. 1 illustrates a known DC coupled arrangement of laser driver and a laser module.
Figure 2:
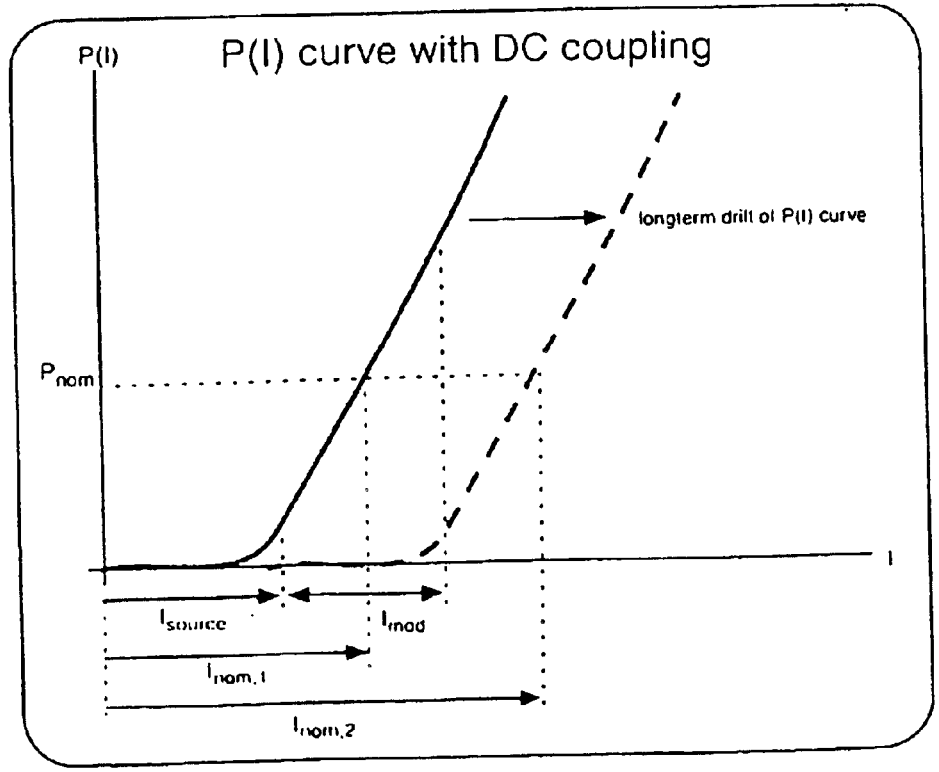
FIG. 2 illustrates the relationship of currents for the laser module of FIG. 1 and its optical output power in dependence of operation time aging effects.
Figure 3:
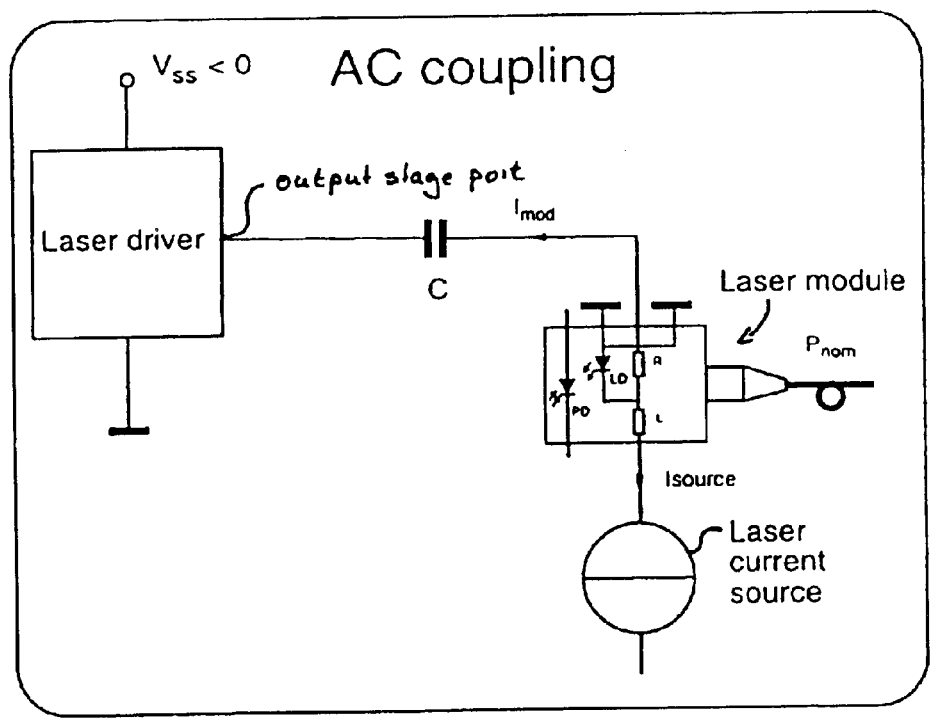
FIG. 3 illustrates the basic principal underlying the present invention.
Figure 4:
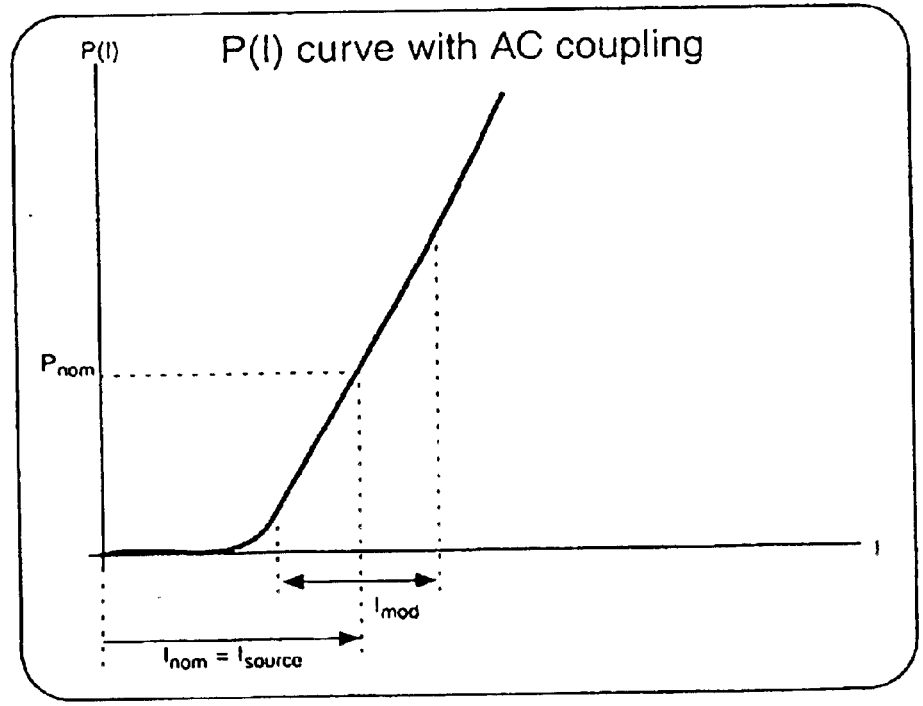
FIG. 4 illustrates the relationship of currents for the laser module of FIG. 3 and its optical output power in dependence of operation time aging effects.
Figure 5:
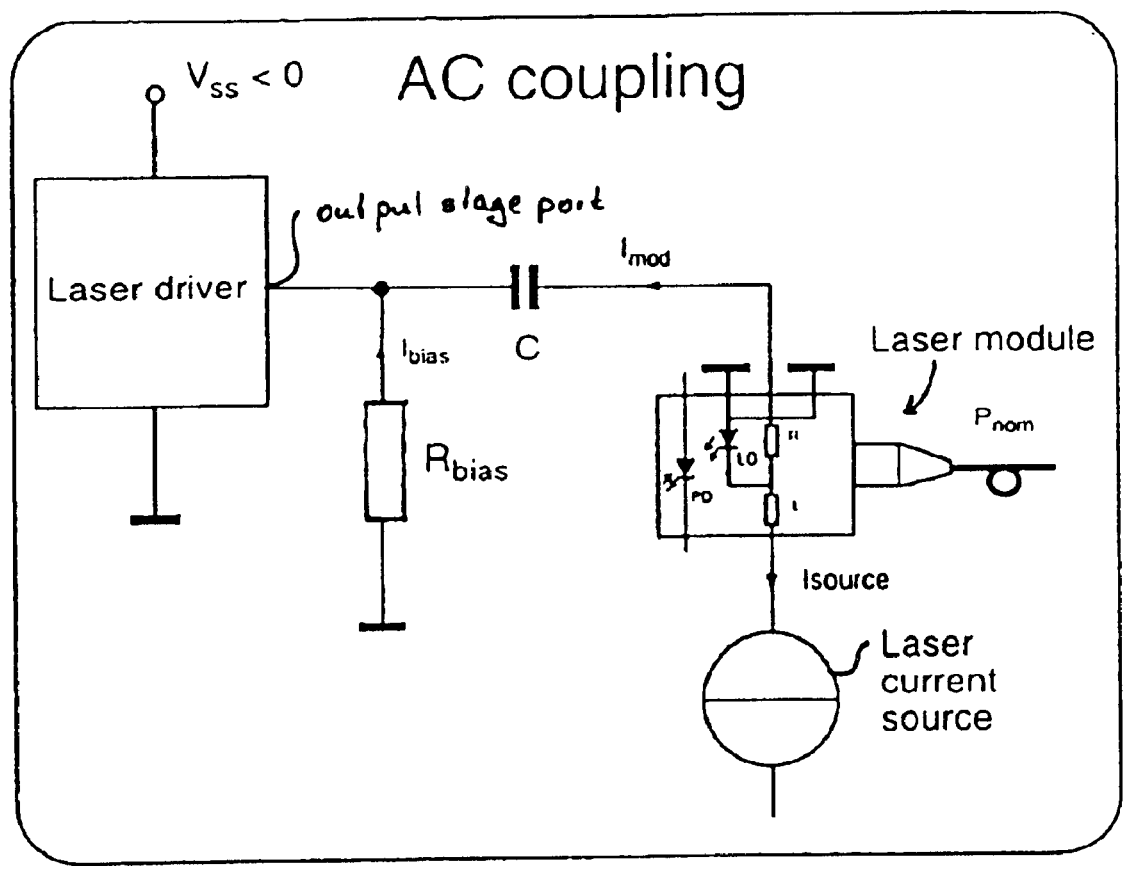
FIG. 5 illustrates a basic AC coupled arrangement of the laser driver and a laser module according to the present invention.

In order to maintain the nominal optical output power of a laser module only by means of an adjustment of a supply current for the laser module, the principle arrangement, i.e. an AC coupling, as shown in FIG. 3, is employed. As set forth above, available laser drivers require a bias current to be applied to its output stage port. This can be obtained by coupling a bias resistor $R_{bias}$ between ground and the output stage port of the laser driver as illustrated in FIG. 5. This solution allows to compensate changes of the optical output power of the laser module, for example due to aging effects by a respective adjustment of the supply current $I_{source}$ for the laser module.

Further referring to the foregoing, the grounded bias resistor $R_{bias}$ increases the AC load for the laser driver. Thus, the current outputted from the output stage from the laser driver is partitioned into the bias current $I_{bias}$ resulting from the bias resistor $R_{bias}$ and the modulation current $I_{mod}$ provided to the laser module. As a result, the maximum available modulation amplitude of the modulation current $I_{mod}$ is decreased.

The embodiment shown in FIG. 5 is sufficient for cases wherein the modulation amplitude of the modulation current $I_{mod}$ actually provided to the laser module still allows for a desired laser module/diode modulation in spite of the reduction of the maximum modulation amplitude due to the grounded bias resistor $R_{bias}$.

Figure 6:
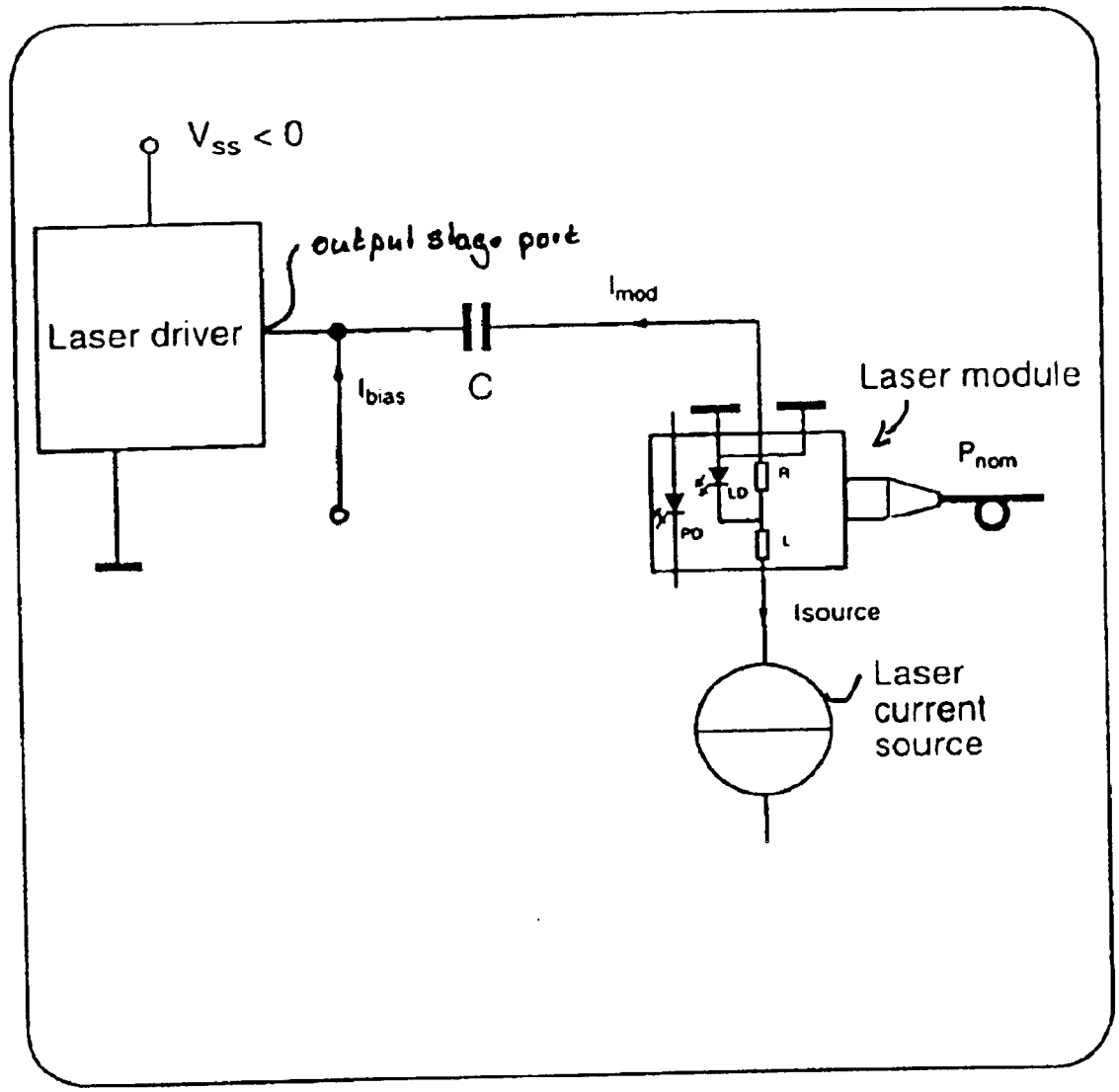
FIG. 6 illustrates a further principal underlying the present invention.
Figure 7:
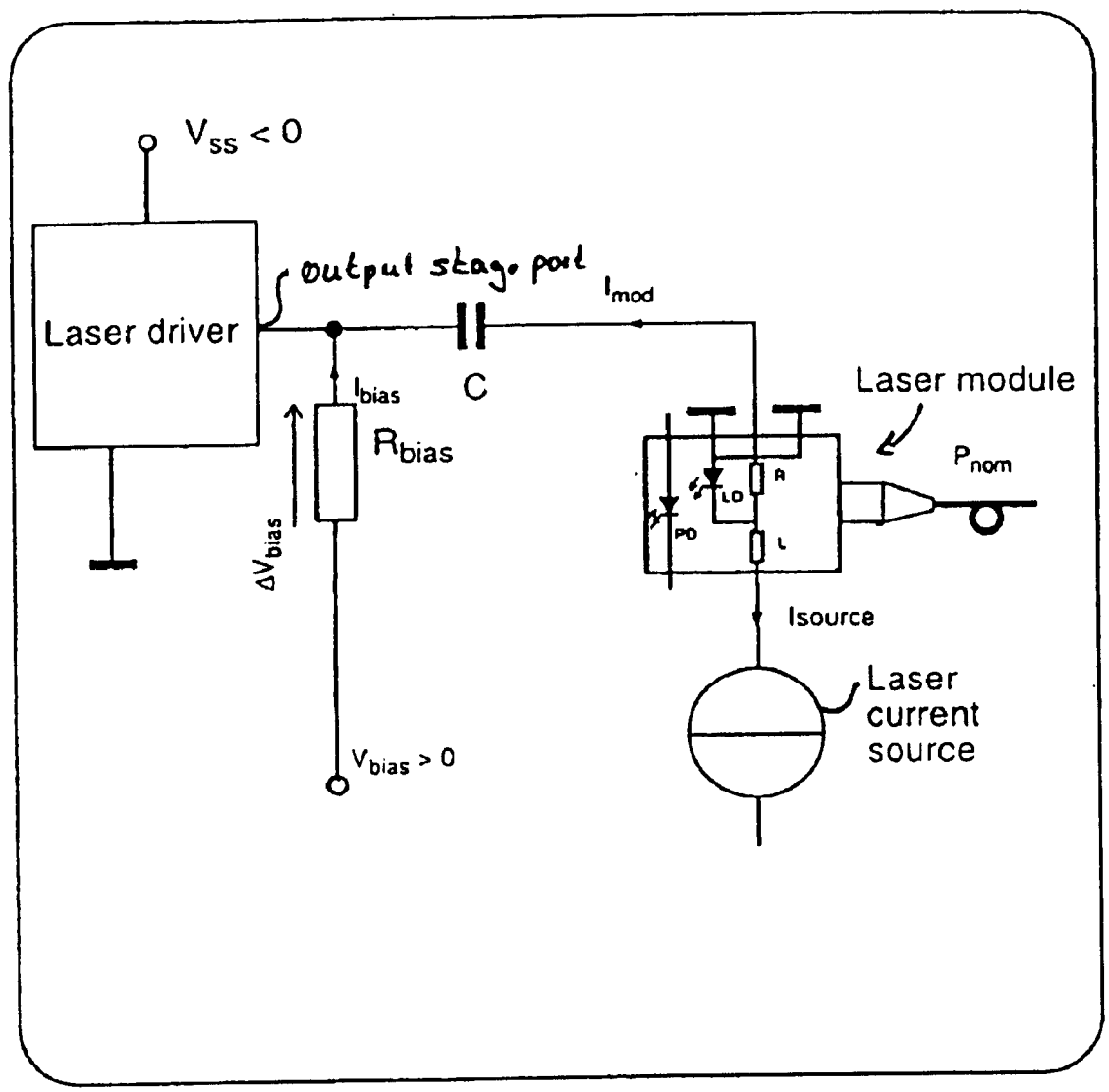
FIGS. 7 to 10 illustrate embodiments according to the present invention.

In cases where an decrease of the maximum available modulation amplitude for the laser module is not desired, an enhanced principle being illustrated in FIG. 6 is utilized. The solution illustrated in FIG. 5 can be considered as a "passive" solution since the bias current $I_{bias}$ for the output stage port is generated in response to the current provided via the output stage of the laser driver. In contrast thereto, the solution illustrated in FIG. 6 can be considered as "active" solution since a bias current $I_{bias}$ necessary for a proper operation of the laser driver is actively supplied to its output stage port.

In principle, the bias current $I_{bias}$ used in the embodiment shown in FIG. 6 can be provided by means of a current source. In order to avoid problems associated with the arrangement of a current source for the bias current $I_{bias}$ with respect to the laser driver (e.g. definition of potentials), the embodiment shown in FIG. 7 can be utilized. Here, a bias resistor $R_{bias}$ is connected to a bias voltage $V_{bias}$ which has a more positive potential than ground of FIG. 5. Assuming ground of FIG. 5 has a potential being equal to zero, the bias voltage $V_{bias}$ has a positive potential.

As a result, the voltage drop $\Delta V_{bias}$ across the bias resistor $R_{bias}$ connected to the bias voltage $V_{bias}$ is higher compared to the voltage drop across the bias resistor of FIG. 5. Thus, the bias resistor $R_{bias}$ of FIG. 7 can be selected to be significantly higher compared to the arrangement shown in FIG. 5 to evoke the same bias current $I_{bias}$ for the laser driver. This leads to a reduction of the AC load for the laser driver compared to the solution of FIG. 5. As a result, most of the current provided via the output stage port can be supplied to the laser module as modulation current $I_{mod}$.

Depending on the operation of the laser driver, it is possible, that the voltage drop $\Delta V_{bias}$ across the bias resistor $R_{bias}$ is such that the output stage port of the laser driver is exposed to a positive potential. In view of the assumed negative supply voltage $V_{ss}$ for the laser driver this can lead to failures since ground, here a potential of zero, is the most positive potential which is allowed to be connected to a port of the laser driver, such as its output stage port. Such a condition can occur in case, for example, a low modulation, i.e. a small modulation current $I_{mod}$, is supplied to the laser module. Then, the laser driver and in particular its output stage will draw a bias current $I_{bias}$ via the bias resistor $R_{bias}$ leading to a voltage drop $\Delta V_{bias}$ resulting in a positive potential being applied to the output stage port. In contrast thereto, such a critical situation will not occur in the case of higher modulations, e.g. higher modulation currents $I_{mod}$, wherein the output stage will draw a bias current $I_{bias}$ via the bias resistor $R_{bias}$ resulting in a voltage drop $\Delta V_{bias}$ being sufficient to provide for a ground potential or a lower potential being applied to the output stage port.

Figure 8:
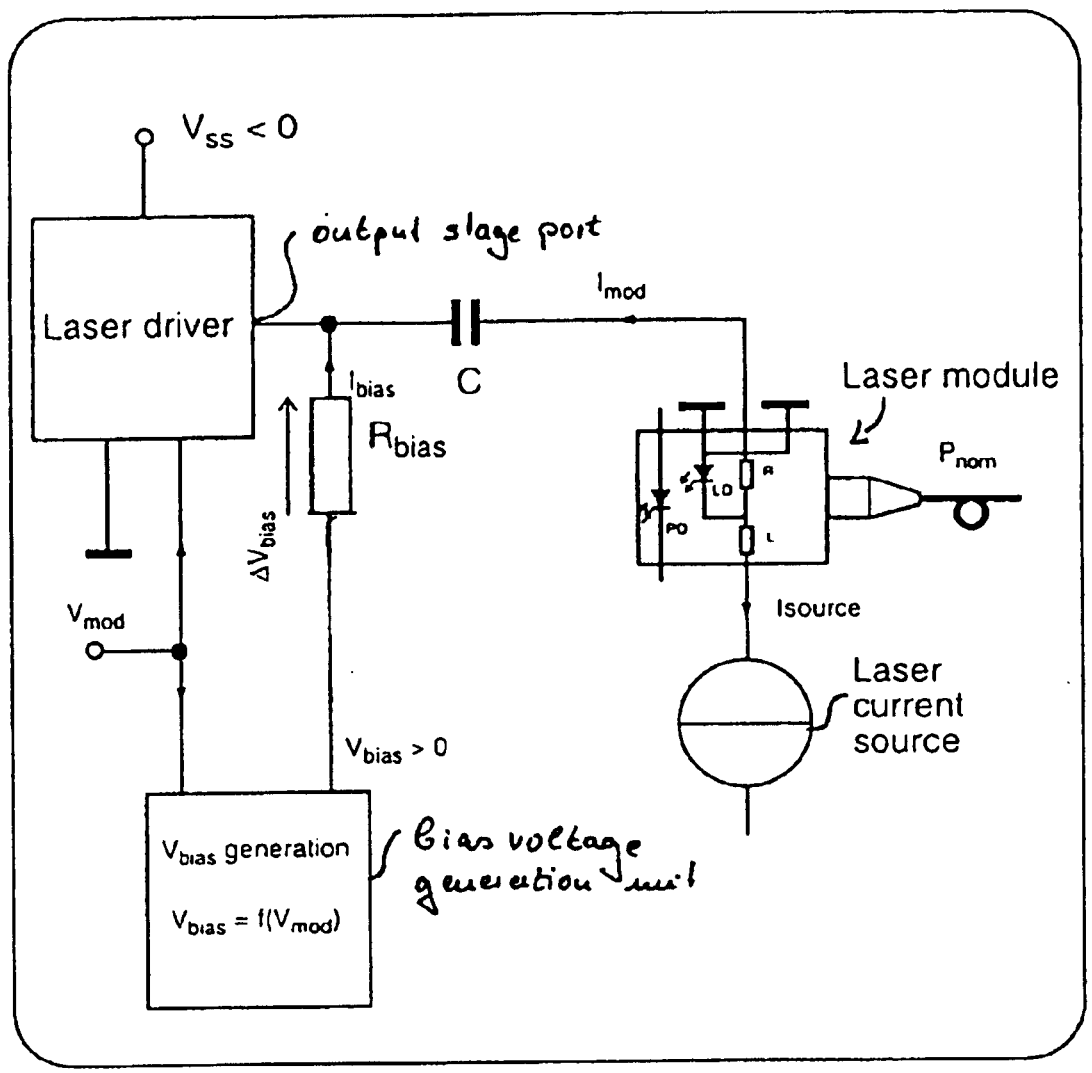

In order to avoid, if necessary, such critical potentials for the output stage of the laser driver, the embodiment illustrated in FIG. 8 can be employed. According to FIG. 7, the bias resistor $R_{bias}$ is connected to a fixed voltage. Contrary thereto, the bias resistor $R_{bias}$ is, as shown in FIG. 8, connected to a bias voltage generation unit providing for a bias voltage $\Delta V_{bias}$ varying with the modulation current actually supplied to the laser module. In particular, a modulation voltage $V_{mod}$ used for controlling the modulation provided by the laser driver is further utilized to control the generation of the bias current $V_{bias}$.

For avoiding the above described problem of a possible positive potential being applied to the output stage port, the transfer function correlating the modulation voltage $V_{mod}$ and the generated bias voltage $V_{bias}$ has to be respectively defined. Such a transfer function or function characterizing the characteristics of the bias voltage generation unit mainly depends on the laser driver, the laser module, the modulation to be provided and the like.

As a result, the modulation voltage $V_{mod}$ varied in view of the modulation to be provided for the last module also controls the bias voltage $V_{bias}$ such that a sufficient bias current $I_{bias}$ is applied to the output stage port while a positive potential being applied to the output stage port is avoided.

Figure 9:
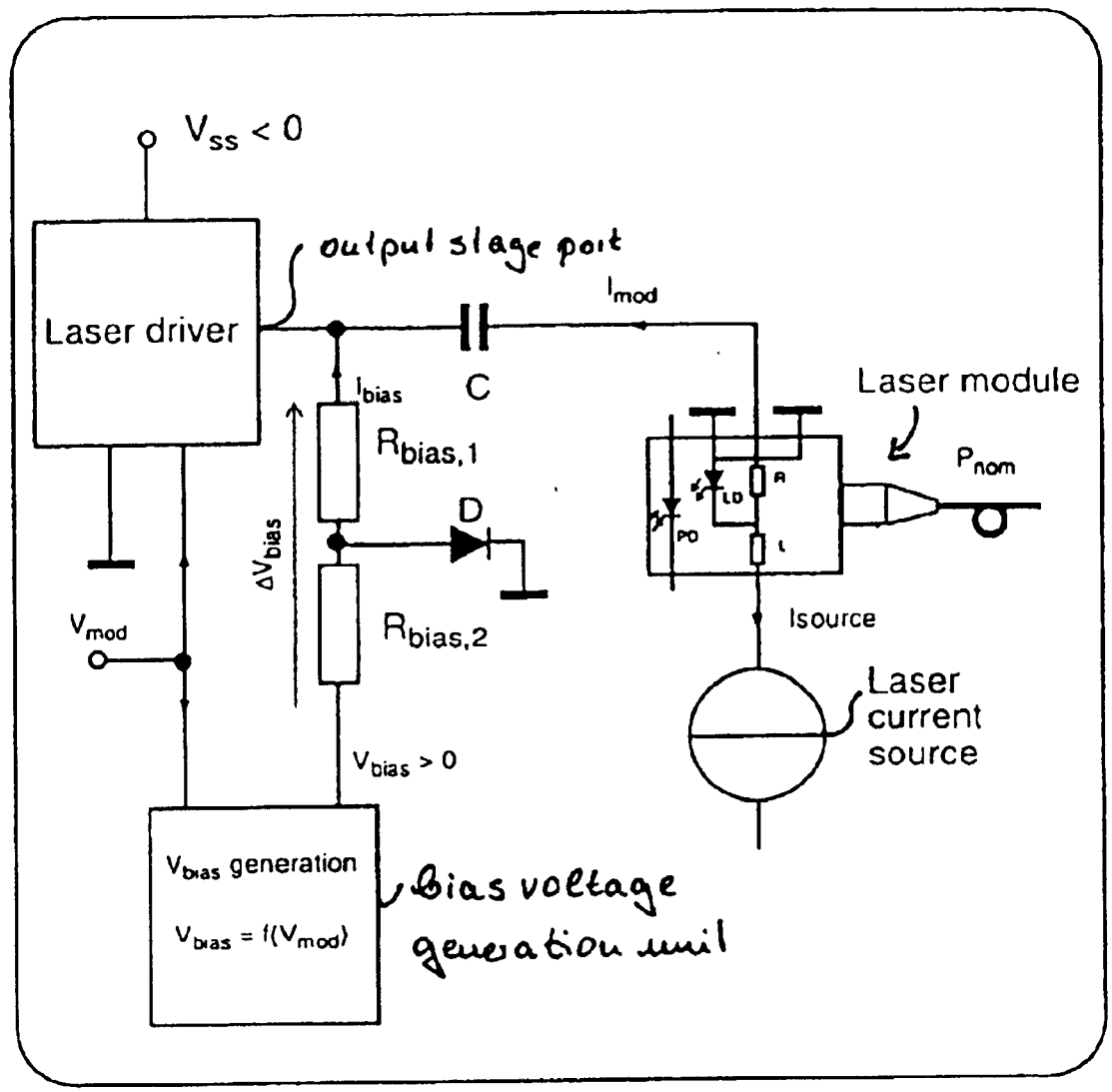

An enhanced reliability for the embodiment shown in FIG. 8 can be achieved by a modification as illustrated in FIG. 9. Here, the effective bias resistor comprises bias resistors $R_{bias,1}$ and $R_{bias,2}$. A protection diode D is coupled between these bias resistors and connected to ground. In the case of failures of the generation of the bias voltage $V_{bias}$ and in particular of failures of the bias voltage generation unit, the protection diode D prevents a positive potential to be applied to the output stage port. Advantageously, the protection diode D has a very low forward voltage which can be obtained for example by means of a Schottky diode. Further, the partitioning of the effective bias resistor into the bias resistor $R_{bias1}$, and $R_{bias,2}$ should be done accordingly.

Figure 10:
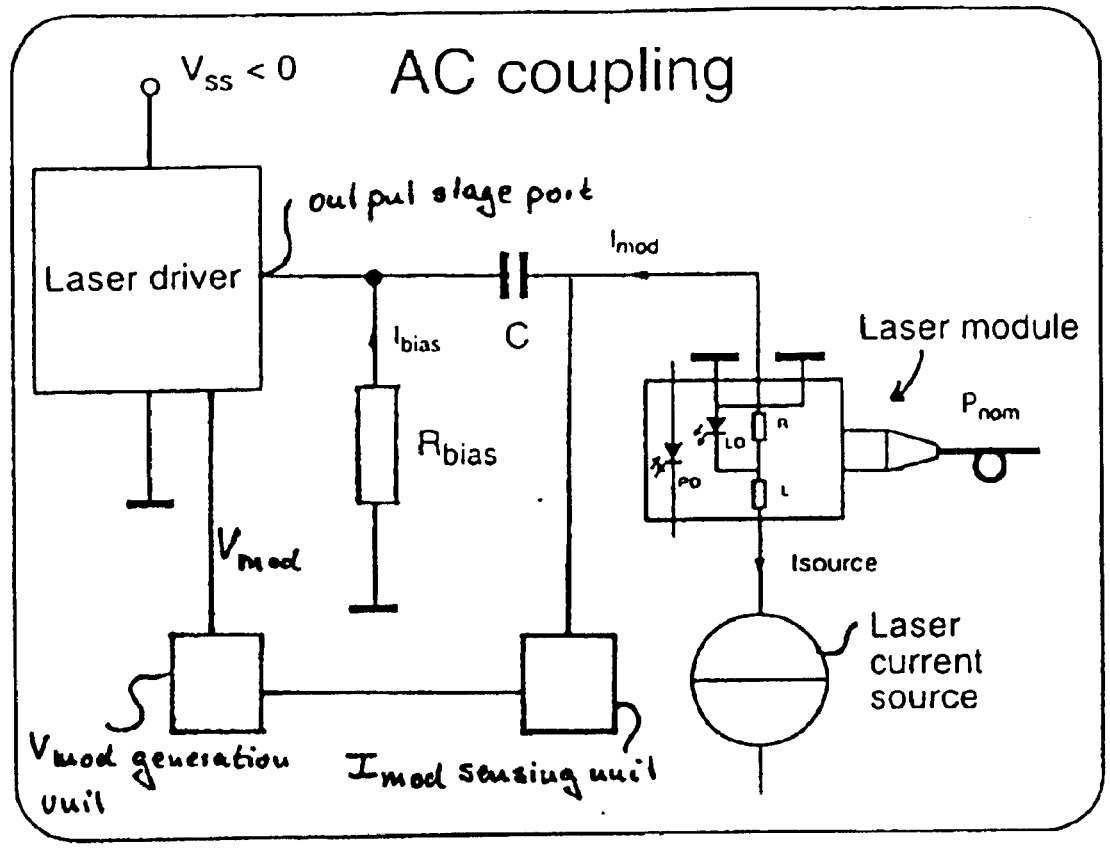

For a further "active" solution it is referred to FIG. 10 which illustrates a modification of the embodiment shown in FIG. 5. In addition to the components of FIG. 5, FIG. 10 shows a modulation voltage generation unit and a modulation current sensing unit. The modulation voltage generation unit supplies a modulation voltage $V_{mod}$ for controlling the modulation provided by the laser driver, i.e. the modulation current $I_{mod}$ for the laser module. The modulation current sensing unit is coupled to determine the modulation current $I_{mod}$ actually provided to the laser module.

As set forth above, the bias resistor $R_{bias}$ connected to ground will result in a decrease of the modulation current $I_{mod}$ supplied to the laser module compared to the current provided via the output stage port of the laser driver.

The modulation current sensing unit provides, to the modulation voltage generation unit, information/data being characteristic of the modulation current $I_{mod}$ for the laser module. In response thereto, the modulation voltage generation unit varies the modulation voltage $V_{mod}$ such that the partitioning of the current provided via the output stage port of the laser driver will not result in a modulation current $I_{mod}$ being not sufficient to provide the modulation desired for the laser module. Since the bias resistor $R_{bias}$ is connected to ground, it is avoided that a potential being higher than ground is applied to the output stage port independently of the modulation current $I_{mod}$ for the laser module.

As an alternative to the solution shown in FIG. 10 or in combination therewith, the bias resistor $R_{bias}$ can be embodied as a variable resistor. As above, a (or the) modulation current sensing unit is used to determine the actual modulation current $I_{mod}$ for the laser module. In dependence of the determined modulation current $I_{mod}$, the value of the bias resistor $R_{bias}$ is controlled by a bias resistor variation unit such that the necessary bias current $I_{bias}$ is provided to the laser driver while a proper modulation current $I_{mod}$ can still be supplied to the laser module.

In combination with the solution based on a control of the modulation voltage for the laser driver, the utilization of a variable bias resistor represents a combined active and passive solution, wherein the active solution is provided by means of the bias resistor variation unit while the passive solution is obtained by means of the modulation voltage generation unit and the bias resistor being connected to ground.

The solutions described above allows to operate laser drivers in an AC coupled arrangement with respect to laser modules. Further, these solutions provide a reliable and stable operation of laser modules both, in the short term and the long term operating in order to, for example, maintain the nominal optical output power and extinction ratio for a laser module.

What is claimed is:

1. An apparatus for modulating a laser module, comprising:

a laser driver having an output stage port providing a modulation current for modulating a laser module, a unit for AC coupling the output stage port to a laser module such that the modulation current can be AC coupled to the laser module, and a bias current providing unit comprising a bias resistor coupled between the output stage port and the laser module for providing a bias current to the output stage port to compensate changes of the optical output power of the laser module due to aging effects by a respective adjustment of the supply current for the laser module wherein the bias resistor is coupled to a bias voltage.

2. Apparatus according to claim 1, wherein:

the bias resistor being connected to a bias voltage generation unit.

3. Apparatus according to claim 2, wherein:

the bias voltage generation unit being controlled by a modulation voltage controlling the operation of the laser driver.

4. Apparatus according to claim 1, wherein:

the bias resistor further comprising a first bias resistor and a second bias resistor, and, a protection diode being coupled between the first and second bias resistors and connected to ground.

5. An apparatus for modulating a laser module, comprising:

a laser driver having an output stage port providing a modulation current for modulating laser module, a unit for AC coupling the output stage port to a laser module such that the modulation current can be AC coupled to the laser module, and a bias current providing unit comprising a bias resistor coupled between the output stage port and the laser module, for providing a bias current to the output stage port to compensate changes of the optical output power of the laser module due to aging effects by a respective adjustment of the supply current for the laser module, wherein the bias resistor being connected to ground.

6. Apparatus according to claim 5, further comprising:

a modulation current sensing unit for determining the modulation current to be supplied to the laser module, and a modulation voltage generation unit for generating a modulation voltage for controlling the operation of the laser driver, the operation of the modulation voltage generation unit being controlled by the modulation current sensing unit.

7. Apparatus according to claim 5, further comprising:

a modulation current sensing unit for determining the modulation current to be supplied to the laser module, and a bias resistor variation unit for varying the value of the bias resistor for controlling the bias current, the bias resistor variation unit being controlled by the modulation current sensing unit.

8. A method for modulating a laser module, comprising the steps of:

generating a modulation current by a laser driver, the modulation current being supplied via an output stage port of the laser driver, providing for an AC coupling of the output stage port with a laser module such that the modulation current can be AC coupled to the laser module, and supplying a bias current to the output stage port via a bias resistor being coupled between the output stage port and the laser module to compensate changes of the optical output power of the laser module due to aging effects by a respective adjustment of the supply current for the laser module by connecting the bias resistor to a bias voltage.

9. Method according to claim 8, comprising the step of:

generating the bias voltage by means of a bias voltage generating unit.

10. Method according to claim 8, comprising the steps of:

determining the modulation current to be supplied to the laser module by means of a modulation current sensing unit, and generating a modulation voltage for controlling the operation of the laser driver, the generating of the modulation voltage being controlled in dependence of the determined modulation current.

11. Method according to claim 8, comprising the steps of:

determining the modulation current to be supplied to the laser module by means of a modulation current sensing unit, and varying the value of the bias resistor for controlling the bias current, the varying of the bias resistor being controlled in dependence of the determined modulation current.

12. Method according claim 8, wherein the coupling of the bias resistor to the output stage port comprises the steps of:

coupling a first bias resistor to the output stage port, coupling a second bias resistor to the first bias resistor, and coupling a protection diode between the first and second bias resistors and connecting the protection diode to ground.

13. Method according to claim 9, comprising the step of:

controlling the operation of the bias voltage generation unit by a modulation voltage for controlling the operation of the laser driver.

14. A method for modulating a laser module, comprising the steps of:

generating a modulation current by a laser driver, the modulation current being supplied via an output stage port of the laser driver, providing for an AC coupling of the output stage port with the laser module such that the modulation current can be AC coupled to the laser module, and supplying a bias current to the output stage port via a bias resistor being coupled between the output stage and the laser module to compensate changes of the optical output power of the laser module due to aging effects by a respective adjustment of the supply current for the laser module by coupling the bias resistor to ground.

15. Method according to claim 14, comprising the steps of:

determining the modulation current to be supplied to the laser module by means of a modulation current sensing unit, and generating a modulation voltage for controlling the operation of the laser driver, the generating of the modulation voltage being controlled in dependence of the determined modulation current.

16. Method according to claim 14, comprising the steps of:

determining the modulation current to be supplied to the laser module by means of a modulation current sensing unit, and varying the value of the bias resistor for controlling the bias current, the varying of the bias resistor being controlled in dependence of the determined modulation current.

17. Method according 14, wherein the coupling of the bias resistor to the output stage port comprises the steps of:

coupling a first bias resistor to the output stage port, coupling a second bias resistor to the first bias resistor, and coupling a protection diode between the first and second bias resistors and connecting the protection diode to ground.

* * * * *

UNITED STATES PATENT AND TRADEMARK OFFICE
CERTIFICATE OF CORRECTION

PATENT NO.       : 6,810,051 B2
APPLICATION NO.  : 10/346929
DATED            : October 26, 2004
INVENTOR(S)      : Doil It is certified that error appears in the above-identified patent and that said Letters Patent is hereby corrected as shown below:

In Column 2, Line 8, delete "drive" and insert -- drift --, therefor.

In Column 2, Line 38, delete "measured" and insert -- measures --, therefor.

In Column 3, Line 19, delete "drives" and insert -- drivers --, therefor.

In Column 3, Line 54, delete "of" and insert -- for --, therefor.

In Column 4, Line 45, delete "alternate" and insert -- alternative --, therefor.

In Column 7, Line 2, delete "last" and insert -- laser --, therefor.

In Column 7, Line 19, delete "$R_{bias1}$," and insert -- $R_{bias.\ 1}$ --, therefor.

Signed and Sealed this

Thirtieth Day of October, 2007

JON W. DUDAS
*Director of the United States Patent and Trademark Office*